US006068965A

United States Patent [19]

Hauquier et al.

[11] Patent Number: 6,068,965

[45] Date of Patent: May 30, 2000

[54] HEAT-SENSITIVE IMAGING MATERIAL AND METHOD FOR MAKING ON-PRESS LITHOGRAPHIC PRINTING PLATES REQUIRING NO SEPARATE PROCESSING

[75] Inventors: Guy Hauquier, Nijlen; Joan Vermeersch, Deinze; Marc Van Damme, Heverlee; Inge Claes, Kessel, all of Belgium

[73] Assignee: Agfa-Gevaert, N.V., Mortsel, Belgium

[21] Appl. No.: 09/241,296

[22] Filed: Feb. 1, 1999

Related U.S. Application Data

[60] Provisional application No. 60/079,868, Mar. 30, 1998.

[30] Foreign Application Priority Data

Feb. 9, 1998 [EP] European Pat. Off. .............. 98200373

[51] Int. Cl.$^7$ ........................................................ G03F 7/11

[52] U.S. Cl. ........................ 430/302; 430/273.1; 430/945

[58] Field of Search ................................ 430/302, 273.1, 430/270.1, 271.1, 945

[56] References Cited

U.S. PATENT DOCUMENTS

| | | | |
|---|---|---|---|
| 5,401,611 | 3/1995 | Edwards, Sr. et al. . | |
| 5,908,731 | 6/1999 | Leenders et al. | 430/273.1 |

FOREIGN PATENT DOCUMENTS

| | | |
|---|---|---|
| 0 573 092 A1 | 12/1993 | European Pat. Off. . |
| 0 816 071 A1 | 1/1998 | European Pat. Off. . |
| 1 482 665 | 8/1977 | United Kingdom . |

*Primary Examiner*—Janet Baxter
*Assistant Examiner*—Barbara Gilmore
*Attorney, Agent, or Firm*—Breiner & Breiner

[57] ABSTRACT

According to the present invention there is provided a method for making on-press lithographic printing plates which require no processing. The method comprises the steps of:

a. mounting a heat-sensitive imaging material, comprising on a lithographic base having a hydrophilic surface, a metallic layer or a metal oxide layer and on top thereof an oleophobic layer having a thickness of less than 5 $\mu$m, on a print cylinder of a printing press;
b. image-wise exposing said imaging material with an IR-laser;
c. rotating said print cylinder while supplying an aqueous dampening liquid and/or ink to said image forming layer of said imaging material.

10 Claims, No Drawings

HEAT-SENSITIVE IMAGING MATERIAL AND METHOD FOR MAKING ON-PRESS LITHOGRAPHIC PRINTING PLATES REQUIRING NO SEPARATE PROCESSING

This application claims priority from Provisional Application number 60/079,868 filed Mar. 30, 1998.

FIELD OF THE INVENTION

The present invention relates to a method for making lithographic printing plates. More specifically the invention relates to a method using a heat-sensitive imaging element that requires no separate processing and that can be imaged on-press.

BACKGROUND OF THE INVENTION

Lithographic printing is the process of printing from specially prepared surfaces, some areas of which are capable of accepting ink, whereas other areas will not accept ink.

In the art of photolithography, a photographic material is made imagewise receptive to oily or greasy ink in the photo-exposed (negative working) or in the non-exposed areas (positive working) on a ink-repelling background.

In the production of common lithographic plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers. Particularly diazo-sensitized systems are widely used.

Upon imagewise exposure of such light-sensitive layer the exposed image areas become insoluble and the unexposed areas remain soluble. The plate is then developed with a suitable liquid to remove the diazonium salt or diazo resin in the unexposed areas.

On the other hand, methods are known for making printing plates involving the use of imaging elements that are heat-sensitive rather than photosensitive. A particular disadvantage of photosensitive imaging elements such as described above for making a printing plate is that they have to be shielded from the light. Furthermore they have a problem of stability of sensitivity in view of the storage time and they show a lower resolution. The trend towards heat-sensitive printing plate precursors is clearly seen on the market.

EP-A-444 786, JP-63-208036,and JP-63-274592 disclose photopolymer resists that are sensitized to the near IR. So far, none has proved commercially viable and all require wet development to wash off the unexposed regions. EP-A-514 145 describes a laser addressed plate in which heat generated by the laser exposure causes particles in the plate coating to melt and coalescence and hence change their solubility characteristics. Once again, wet development is required. EP-A-652 483 discloses a lithographic printing plate requiring no dissolution processing which comprises a substrate bearing a heat-sensitive coating, which coating becomes relatively more hydrophilic under the action of heat Said system yields a positive working printing plate. EP-A-609 941 describes a heat-mode recording material comprising on a substrate a metallic layer and a thin hydrophobic layer which becomes hydrophilic upon exposure. However the lithographic performance of the obtained printing plate is poor. EP-A-770 495 discloses a heat-sensitive material and method for making lithographic printing plates that can be imaged on-press. However a wet processing step is required.

OBJECTS OF THE INVENTION

It is an object of the present invention to provide a method whereby the heat-sensitive imaging material for making a lithographic printing plate is imaged on-press and whereby printing plates having a high lithographic performance (ink acceptance, scratch resistance, durability) are obtained.

SUMMARY OF THE INVENTION

According to the present invention there is provided a method for making lithographic printing plates comprising the steps of:

a. mounting a heat-sensitive imaging material, comprising on a lithographic base having a hydrophilic surface, a metallic layer or a metal oxide layer and on top thereof an oleophobic layer having a thickness of less than 5 μm, on a print cylinder of a printing press;
b. image-wise exposing said imaging material with an IR-laser;
c. rotating said print cylinder while supplying an aqueous dampening liquid and/or supplying ink to said image forming layer of said imaging material.

The present invention also provides a method for making multiple copies of an original comprising the steps of:

a. mounting a heat-sensitive imaging material, comprising on a lithographic base having a hydrophilic surface, a metallic layer or a metal oxide layer and on top thereof an oleophobic layer having a thickness of less than 5 μm, on a print cylinder of a printing press;
b. image-wise exposing said imaging material with an IR-laser;
c. rotating said print cylinder while supplying an aqueous dampening liquid and/or supplying ink to said image forming layer of said imaging material and
d. transferring ink from said imaging material to a receiving element.

DETAILED DESCRIPTION OF THE INVENTION

It has been found that by imaging a heat-sensitive imaging material in accordance with the present invention on the press, lithographic printing plates requiring no processing and having a high lithographic performance can be obtained.

Metallic layers or metal oxide layers suitable for use in accordance with the invention comprise metals or metal oxides converting the actinic radiation to heat so that the oleophobicity of the oleophobic top-layer is destroyed. The thickness of the metallic layer or metal oxide layer is preferably from 0.01 μm to 2 μm, and most preferably from 0.05 μm to 1.5 μm. Specific examples of metal layers or metal oxide layers are aluminum, titanium oxide, bismuth and silver of which the latter three are preferred.

A silver layer for use in this invention as the metallic layer can be made according to the principles of the silver complex diffusion transfer reversal process, hereinafter called DTR-process, having been described e.g. in U.S. Pat. No. 2,352,014 and in the book "Photographic Silver Halide Diffusion Processes" by André Rott and Edith Weyde—The Focal Press—London and New York, (1972).

In the DTR-process non-developed silver halide of an information-wise exposed photographic silver halide emulsion layer material is transformed with a so-called silver halide solvent into soluble silver complex compounds which are allowed to diffuse into an image-receiving element and are reduced therein with a developing agent, generally in the presence of physical development nuclei, to form a silver image having reversed image density values ('DTR-image') with respect to the black silver image obtained in the exposed areas of the photographic material.

In another method for providing a metal layer on the lithographic base having a hydrophilic surface a silver halide emulsion disposed on a hydrophilic substrate is strongly exposed to actinic radiation and then developed, or otherwise processed to maximum blackness. The black opaque emulsion is converted to a reflective recording material by heating at least to 270° C. in an oxygen containing environment until the emulsion coating assumes a shiny reflective appearance. Such method is disclosed in U.S. Pat. No. 4,314,260.

According to an alternative method for providing a metal layer on the lithographic base having a hydrophilic surface the metal is provided using vapour or vacuum deposition.

According to another embodiment of the invention the metallic layer can be a bismuth layer that can be provided by vacuum deposition.

A drawback of the method of preparation of a thin bismuth recording layer by vacuum deposition is the fact that this is a complicated, cumbersome and expensive process.

Therefore, in EP-A-97201282 the vacuum deposition is replaced by coating from an aqueous medium. According to this disclosure a thin metal layer is formed by the following steps:

(1) preparing an aqueous medium containing ions of a metal, (2) reducing said metal ions by a reducing agent thus forming metal particles, (3) coating said aqueous medium containing said metal particles on a transparent support.

As a metal oxide layer preferably a titanium oxide layer is used. This layer can be applied to the substrate by vacuum deposition, electron-beam evaporation or sputtering.

The oleophobic layer provided on top of the metallic layer or metal oxide layer preferably comprises of a polymer containing phenolic groups. Preferred polymers containing phenolic groups are phenolic resins (e.g. novolac) or hydroxyphenyl substituted polymers (e.g. polyhydroxystyrenes). The oleophobic layer has a thickness of less than 5 μm. As a consequence a highly sensitive heat-sensitive imaging element is obtained. The use of a polymer containing phenolic groups furthermore improves the lithographic performance (ink acceptance, scratch resistance, durability) of the lithographic printing plates obtained according to the present invention.

Other suitable compounds, preferably for a silver layer, to be used in the oleophobic layer are compounds which contain a mercapto or a thiolate group and one or more hydrophobic substituents e.g. an alkyl containing at least three carbon atoms. Examples of these compounds for use in accordance with the present invention are e.g. phenyl mercaptotetrazoles or those described in U.S. Pat. Nos. 3,776,728 and 4,563,410. The most preferred compounds are described in EP-A 609 941.and correspond to one of the following formulas:

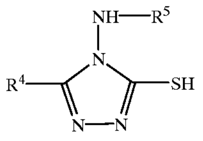

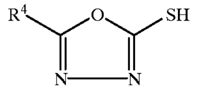

wherein $R^5$ represents hydrogen or an acyl group, $R^4$ represents alkyl, aryl or aralkyl. Most preferably used compounds are compounds according to one of the above formulas wherein $R^4$ represents an alkyl containing 3 to 16 C-atoms.

According to the present invention, the lithographic base comprises a flexible support, such as e.g. paper or plastic film, provided with a hardened hydrophilic layer. A particularly suitable hardened rough hydrophilic layer may be obtained from a hydrophilic binder hardened with a hardening agent such as formaldehyde, glyoxal, polyisocyanate or preferably a hydrolysed tetra-alkylorthosilicate.

As hydrophilic binder there may be used hydrophilic (co)polymers such as for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers.

A hardened hydrophilic layer on a flexible support used in accordance with the present embodiment preferably also contains substances that increase the mechanical strength and the porosity of the layer e.g. colloidal silica. In addition inert particles of larger size than the colloidal silica can be added e.g. silica prepared according to Stober as described in J. Colloid and Interface Sci., Vol. 26, 1968, pages 62 to 69 or alumina particles or particles having an average diameter of at least 100 nm which are particles of titanium dioxide or other heavy metal oxides. Incorporation of these particles gives the surface of the hardened hydrophilic layer a uniform rough texture consisting of microscopic hills and valleys.

The thickness of the hardened hydrophilic layer may vary in the range of 0.2 to 25 μm and is preferably 1 to 10 μm.

Particular examples of suitable hardened hydrophilic layers for use in accordance with the present invention are disclosed in EP-A 601 240, GB-P-1 419 512, FR-P-230 354, U.S. Pat. Nos. 3,971,660, 4,284,705 and EP-A 514 490.

As support on which the hydrophilic layer is provided it is particularly preferred to use a plastic film e.g. substrated polyethylene terephthalate film, cellulose acetate film, polystyrene film, polycarbonate film etc . . . The plastic film support may be opaque or transparent.

It is particularly preferred to use a polyester film support to which an adhesion improving layer has been provided. Particularly suitable adhesion improving layers for use in accordance with the present invention comprise a hydrophilic binder and colloidal silica as disclosed in EP-A-619 524, EP-A-620 502 and EP-A-619 525. Preferably, the amount of silica in the adhesion improving layer is between 200 mg per $m^2$ and 750 mg per $m^2$. Further, the ratio of silica to hydrophilic binder is preferably more than 1 and the surface area of the colloidal silica is preferably at least 300 $m^2$ per gram, more preferably a surface area of 500 $m^2$ per gram.

In accordance to one embodiment of the present invention the heat-sensitive imaging material is mounted on the press and image-wise exposed. The printing press is then started and while the print cylinder with the imaging element mounted thereon rotates, the dampener rollers that supply dampening liquid are dropped on the imaging element and subsequent thereto the ink rollers are dropped. Generally, after about 10 revolutions of the print cylinder the first clear and useful prints are obtained.

According to an alternative method, the ink rollers and dampener rollers may be dropped simultaneously or the ink rollers may be dropped first.

According to another embodiment of the present invention after the heat-sensitive imaging element has been exposed a dry or wet cleaning step is performed by applying brush rollers or rollers that supply plain water to avoid contamination of the dampening solution and ink.

The printing plates of the present invention can also be used in the printing process as a seamless sleeve printing plate. This cylindrical printing plate wich has as diameter the diameter of the print cylinder is slided on the print cylinder instead of applying in a classical way a classically formed printing plate. More details on sleeves are given in 'Grafisch Nieuws' ed. Keesing, 15, 1995, page 4 to 6.

In accordance to the method of the present invention for obtaining a lithographic printing plate the heat-sensitive imaging element is image-wise scanning exposed using a laser, preferably a laser that operates in the infrared or near-infrared, i.e. wavelenght rang of 700–1500 nm. Most preferred are laser diodes emitting in the near-infrared. Preferably the laser used is a multibeam laser.

The following examples illustrate the present invention without limiting it thereto. All parts and percentages are by weight unless otherwise specified.

EXAMPLES

Example 1

Preparation of the DTR Material

On the back of a polyethylene terephtalate support with a thickness of 175$\mu$, was coated a layer from a 11% wt solution in demineralized water (pH=4), with a wet thickness of 50 $\mu$m. The resulting layer contained 74.7% of titaniumdioxide, 8.6% of polyvinylalcohol, 16.2% of hydrolysed tetramethylorthosilicate and 0.5% of wetting agents.

On the other side of the polyethylene terephtalate support which is provided with a hydrophilic subbing layer, is first coated a layer from a 20% wt solution in demineralized water (pH=4), with a wet coating thickness of 50 $\mu$m. This layer contained 82.7% of titaniumdioxide, 9.1% of polyvinylalcohol, 8.2% of hydrolysed tetramethylorthosilicate and 0.17% of palladiumsulphide (particle size 2–3 nm). On this base layer, a layer of palladiumsulphide particles (2–3 nm) is coated from a 0.24% wt solution (pH=9) in demineralized water, with a wet thickness of 13 $\mu$m. Finally, an emulsion layer and top layer were simultaneously coated by means of the cascade coating technique. The emulsion layer was coated with a wet thickness of 30 $\mu$m and such that the silver halide coverage expressed as $AgNO_3$ was 2.50 g/m$^2$ and the gelatin content was 1.50 g/m$^2$. The toplayer was coated with a wet thickness of 15 $\mu$m such that the gelatin content was 0.7 g/m$^2$. The top layer further contained 61 mg/m$^2$ of Levanyl Rot and 0.14 g/m$^2$ matting agent.

Preparation of the Heat-Sensitive Imaging Element

To obtain a heat-sensitive imaging element according to the present invention, the unexposed DTR material as described above was developed for 12 s at 24° C. in an aqueous alkaline solution having the following ingredients:

| | | |
|---|---|---|
| Anhydrous sodium sulphite | 120 | g |
| Sodium hydroxide | 22 | g |
| Carboxymethylcellulose | 4 | g |
| Potassium bromide | 0.75 | g |
| Anhydrous sodium thiosulphate | 8 | g |
| Aluminum sulphate.18$H_2O$ | 8 | g |
| Ethylene diamine tetraacetic acid tetrasodium salt | 4.2 | g |
| Hydroquinone | 20 | g |
| Methylfenidon | 6.25 | g |
| Demineralized water to make | 1 | L |
| pH (25° C.) > 12.5 | | |

The initiated diffusion transfer was allowed to continue for 18 s to form a silver layer, whereafter the material was rinsed with water containing 0.03% of trypsine at 50° C.

The thus obtained metallic silver layer was provided with a hydrophobic layer by guiding the material through a finisher at 45° C., having the following composition:

| | | |
|---|---|---|
| Dextran 70000 | 40 | g |
| Polyethyleneglycol 200 | 50 | ml |
| Sodiumdihydrogenphosphate.2$H_2O$ | 20 | g |
| Citric acid | 22 | g |
| Potassium nitrate | 12.5 | g |
| Sodium hydroxide | 12.6 | g |
| 1-phenyl-5-mercaptotetrazole | 0.5 | g |
| Biocide | 0.1 | g |
| Wetting agent | 261.5 | mg |
| Demineralized water to make | 1 | L |
| pH (25° C.) = 5.95 | | |

Exposing the Heat-Sensitive Imaging Element

This material was imaged with an Isomet diode external drum platesetter at 3.2 m/s and 3600 dpi. The power level in the image plane was 253 mW. The plate was printed on a Heidelberg GTO46 printing machine with a conventional ink (Van Son rubberbase) and fountain solution (Rotamatic), by first applying dampening liquid to the surface of the imaging element by dropping the dampening rollers of the printing press and after 5 revolutions the ink rollers were dropped as well.

After 5 further revolutions paper was contacted resulting in excellent prints without any scumming in the IR-exposed areas and good ink-uptake in the unexposed areas.

Example 2

Preparation of the DTR Material

The DTR material was prepared as described in example 1.

Preparation of the Heat-Sensitive Imaging Element

To obtain a heat-sensitive imaging element according to the present invention, the unexposed DTR material was developed for 12s at 24° C. in an aqueous alkaline solution as described in example 1.

The initiated diffusion transfer was allowed to continue for 18 s to form a silver layer, whereafter the material was rinsed with water at 50° C.

The thus obtained metallic silver layer was coated with a novolac layer (2 g/m$^2$ Alvonol SPN452).

Exposing and Printing the Heat-Sensitive Imaging Element

This material was imaged with an Isomet diode external drum platesetter at 3.2 m/s and 3600 dpi. The power level in the image plane was 253 mW. The plate was printed on a Heidelberg GTO46 printing machine under more critical conditions than example 1 with a conventional ink (K+E) and a fountain solution of 5% G671c (commercialy available from Agfa-Gevaert N.V.) +10% isopropanol, by first applying dampening liquid to the surface of the imaging element by dropping the dampening rollers of the printing press and after 5 revolutions the ink rollers were dropped as well.

After 5 further revolutions paper was contacted resulting in excellent prints without scumming in the IR-exposed areas and good ink-uptake in the unexposed areas and a runlenght >3000 prints.

What is claimed is:

1. A method for making a lithographic printing plate comprising the steps of:

a. mounting a heat-sensitive imaging material, comprising on a lithographic base having a hydrophilic surface, a metallic layer or a metal oxide layer and on top thereof an oleophobic layer having a thickness of less than 5 μm, on a print cylinder of a printing press;

b. image-wise exposing said imaging material with an IR-laser;

c. rotating said print cylinder while supplying an aqueous dampening liquid and/or supplying ink to said image forming layer of said imaging material.

2. A method for making multiple copies of an original comprising the steps of:

a. mounting a heat-sensitive imaging material, comprising on a lithographic base having a hydrophilic surface, a metallic layer or a metal oxide layer and on top thereof an oleophobic layer having a thickness of less than 5 μm, on a print cylinder of a printing press;

b. image-wise exposing said imaging material with an IR-laser;

c. rotating said print cylinder while supplying an aqueous dampening liquid and/or supplying ink to said image forming layer of said imaging material and d. transferring ink from said imaging material to a receiving element.

3. A method according to claim 1 wherein said lithographic base comprises a plastic support having thereon a crosslinked hydrophilic layer.

4. A method according to claim 3 wherein said crosslinked hydrophilic layer comprises a hydrophilic binder crosslinked by means of a hydrolysed tetra-alkylorthosilicate.

5. A method according to claim 1 wherein said oleophobic layer contains a polymer having phenolic groups or a hydroxyphenyl substituted polymer.

6. A method according to claim 1 wherein said metallic layer is a metallic silver or bismuth layer.

7. A method according to claim 1 wherein said metal oxide layer is a titaniumoxide layer.

8. A method according to claim 1 wherein said image-wise exposure is carried out by means of a multibeam IR-laser.

9. A method according to claim 1 wherein the imaging material is a web material.

10. A method according to claim 1 wherein a dry or wet cleaning step is performed after the exposure of the heat-sensitive imaging material.

* * * * *